(12) United States Patent
Lee et al.

(10) Patent No.: US 12,063,815 B2
(45) Date of Patent: Aug. 13, 2024

(54) ELECTROLUMINESCENCE DISPLAY DEVICE INCLUDING A DUMMY LIGHT EMITTING LAYER AND A PLURALITY OF TRENCHES SURROUNDING THE DISPLAY AREA

(71) Applicant: LG DISPLAY CO., LTD, Seoul (KR)

(72) Inventors: SungHo Lee, Paju-si (KR); JeongOh Kim, Paju-si (KR); Geumyoung Lee, Paju-si (KR); SeongHo Kang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 438 days.

(21) Appl. No.: 17/540,691

(22) Filed: Dec. 2, 2021

(65) Prior Publication Data

US 2022/0199727 A1 Jun. 23, 2022

(30) Foreign Application Priority Data

Dec. 22, 2020 (KR) .......................... 10-2020-0180811

(51) Int. Cl.
*H10K 59/121* (2023.01)
*H10K 50/84* (2023.01)
*H10K 59/122* (2023.01)
*H10K 59/88* (2023.01)

(52) U.S. Cl.
CPC ......... *H10K 59/1213* (2023.02); *H10K 50/84* (2023.02); *H10K 59/122* (2023.02); *H10K 59/88* (2023.02)

(58) Field of Classification Search
CPC ...... H10K 50/11; H10K 50/84; H10K 50/841; H10K 50/8426; H10K 50/844; H10K 59/12; H10K 59/1213; H10K 59/122; H10K 59/124; H10K 59/88
See application file for complete search history.

(56) References Cited

U.S. PATENT DOCUMENTS

| 10,559,646 | B2 | 2/2020 | Lee et al. | |
|---|---|---|---|---|
| 2020/0176520 | A1* | 6/2020 | Kim | H10K 50/844 |
| 2020/0212140 | A1* | 7/2020 | Huh | H01L 25/0753 |
| 2020/0212159 | A1* | 7/2020 | Lee | H10K 59/131 |
| 2020/0266352 | A1* | 8/2020 | Kubota | H10K 59/124 |
| 2021/0036093 | A1* | 2/2021 | Okabe | H05B 33/02 |

FOREIGN PATENT DOCUMENTS

| KR | 2017-0080306 A | 7/2017 |
|---|---|---|
| KR | 2019-0051690 A | 5/2019 |

* cited by examiner

*Primary Examiner* — Nelson Garces
(74) *Attorney, Agent, or Firm* — POLSINELLI PC (57) ABSTRACT

An electroluminescence display device having a narrow bezel structure includes a substrate, a plurality of pixels, a thin film transistor, a planarization layer, a light emitting diode, a plurality of trenches, a dummy light emitting layer, an encapsulation layer and a cover plate, the substrate includes a display area and a non-display area; a light emitting diode includes an anode electrode, a light emitting layer and a cathode electrode, and is disposed on the planarization layer; a plurality of trenches formed at the planarization layer in the non-display area, and surrounding the display area; and a dummy light emitting layer disposed in the non-display area as to be extended from the light emitting layer.

20 Claims, 6 Drawing Sheets

ELECTROLUMINESCENCE DISPLAY DEVICE INCLUDING A DUMMY LIGHT EMITTING LAYER AND A PLURALITY OF TRENCHES SURROUNDING THE DISPLAY AREA

CROSS-REFERENCE TO RELATED APPLICATION

This application claims the priority of the Korean Patent Application No. 10-2020-0180811 filed on Dec. 22, 2020, which is hereby incorporated by reference in its entirety as if fully set forth herein.

BACKGROUND

Field of the Disclosure

The present disclosure relates to an electroluminescence display device having a narrow bezel structure. More specifically, the present disclosure relates to an electroluminescence display device having a minimum non-display area to realize a super narrow bezel structure.

Description of the Background

An electroluminescence display device among display devices employs a spontaneous emission system, has excellent viewing angle, contrast ratio, and the like, and can be decreased in weight and thickness and is advantageous in power consumption because a separate backlight is not required. Particularly, an organic lighting emitting display (OLED) device among electroluminescence display device can be driven with a low DC voltage, has a high response speed, and has low manufacturing costs. In addition, the electroluminescence display device has merits in having a ultra-thin structure, and utilizing flexibility of an organic material.

An electroluminescent display device includes a plurality of electroluminescent diodes. An electroluminescent diode includes an anode electrode, a light emitting layer that is formed on the anode electrode, and a cathode electrode that is formed on the lighting emitting layer. When a high-potential voltage is applied to the anode electrode and a low-potential voltage is applied to the cathode electrode, holes in the anode electrode and electrons in the cathode electrode move to the lighting emitting layer. When holes and electrons are coupled in the light emitting layer, excitons are formed in the course of excitation and light is generated due to energy from the excitons. An electroluminescent display device displays an image by electrically controlling a quantity of light which is generated in the light emitting layers of a plurality of electroluminescent diodes which are individually partitioned by banks.

In the typical manufacturing process for the electroluminescence display device, a mask is used for depositing the emission material over a determined area in order to ensure the area for adjusting the mask, a marginal area should be required. Therefore, with the conventional manufacturing method, there is a limitation for implementing a narrow bezel structure. Accordingly, a new method and structure for realizing an ultra-narrow bezel structure is required.

SUMMARY

Accordingly, the present disclosure is to provide a large area electroluminescence display device in which the bezel area surrounding the display area is minimized.

The present disclosure is also to provide a large area electroluminescence display device having an ultra-narrow bezel structure by not using a mask for depositing the light emitting layer resulting in eliminating the marginal area required for aligning the mask.

According to an aspect of the present disclosure, there is provided an electroluminescence display device including a substrate including a display area and a non-display area; a plurality of pixels disposed in the display area; a thin film transistor disposed in the pixel; a planarization layer covering the thin film transistor; a light emitting diode including an anode electrode, a light emitting layer and a cathode electrode, and disposed on the planarization layer; a plurality of trenches formed at the planarization layer in the non-display area, and surrounding the display area; a dummy light emitting layer disposed in the non-display area as to be extended from the light emitting layer; an encapsulation layer covering the display area and the non-display area; and a cover plate disposed on the encapsulation layer.

For example, an end edge of the dummy light emitting layer is aligned (or flush) with an end edge of the encapsulation layer.

For example, an end edge of the trench is apart from an end edge of the encapsulation layer into the display area with a predetermined distance.

For example, an end edge of the trench is apart from an end edge of the encapsulation layer to an end edge of the substrate with a predetermined distance.

For example, the trench includes: a top surface; a bottom surface and; a wall surface connecting the top surface to the bottom surface. The dummy light emitting layer is disposed on the top surface and the bottom surface excepting the wall surface.

For example, the plurality of trenches is arrayed with a predetermined distance between an end edge of the substrate and an end edge of the display area.

For example, the plurality of trenches is arrayed as being divided into a plurality of trench groups between an end edge of the substrate and an end edge of the display area.

For example, any one trench group includes a plurality of trenches.

Furthermore, according to an aspect of the present disclosure, there is provided an electroluminescence display device comprising: a substrate including a display area and a non-display area surrounding the display area; a plurality of pixels disposed in the display area; a planarization layer covering the display area and the non-display area on the substrate; an anode electrode disposed in the pixel on the planarization layer; a bank defining an emission area of the anode electrode on the planarization layer; a plurality of trenches formed at the planarization layer and the bank, and disposed in the non-display area as surrounding the display area; a light emitting layer disposed on the bank and the anode electrode, and covering the display area and the non-display area; a cathode electrode disposed on the light emitting layer; an encapsulation layer disposed on the cathode electrode, and covering the display area and the non-display area; and a cover plate disposed on the encapsulation layer.

For example, the light emitting layer covers the display area and the non-display area, within a range of the encapsulation layer. The light emitting layer is deposited on a top surface and a bottom surface of the trench excepting a wall surface of the trench linking the top surface and the bottom surface.

For example, an end edge of the light emitting layer is aligned (or flush) with an end edge of the encapsulation layer.

For example, an end edge of the trench is overlapped with an end edge of the encapsulation layer.

For example, an end edge of the trench is extended from an end edge of the encapsulation layer to an end edge of the substrate.

For example, an end edge of the trench is apart from an end edge of the encapsulation layer into the display area with a predetermined distance.

For example, the plurality of trenches is arrayed as being divided into a plurality of trench groups.

The electroluminescence display device according to the present disclosure may be manufactured without using a mask when depositing the light emitting layer. Therefore, the light emitting layer of the electroluminescence display device according to the present disclosure may have an end edge (or portion) is aligned (or flush) with the end edge of the encapsulation layer. As the light emitting layer is exposed so that the foreign materials such as moistures or gases may intrude through the exposed end edge and then propagates through the light emitting layer, resulting in the degradation of the light emitting element. In order to prevent the degradation of the light emitting element, the present disclosure suggests a plurality of trenches for disconnecting or separating the light emitting layer between the end edge of the light emitting layer and the display area. As the result, the bezel area can be formed as having the minimized size, as well as it prevents the foreign material intruded to the end edge of the light emitting layer from propagating to the display area through the light emitting layer. The electroluminescence display device according to the present disclosure have a structure in which the display area is maximized, and it is possible to provide a high-quality by securing the lifetime of the display elements.

BRIEF DESCRIPTION OF THE DRAWINGS

The accompanying drawings, which are included to provide a further understanding of the disclosure and are incorporated in and constitute a part of the present disclosure, illustrate aspects of the disclosure and together with the description serve to explain the principle of the disclosure.

In the drawings.

DETAILED DESCRIPTION

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing aspects of the present disclosure are merely an example, and thus the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where "comprise", "have", and "include" described in the present specification are used, another part may be added unless "only~" is used. The terms of a singular form may include plural forms unless referred to the contrary.

In construing an element, the element is construed as including an error range although there is no explicit description.

In describing a positional relationship, for example, when a position relation between two parts is described as "on~", "over~", "under~", and "next~", one or more other parts may be disposed between the two parts unless "just" or "direct" is used.

In describing a temporal relationship, for example, when the temporal order is described as "after~", "subsequent~", "next~", and "before~", a case which is not continuous may be included unless "just" or "direct" is used.

In describing a temporal relationship, for example, when the temporal order is described as "after~", "subsequent~", "next~", and "before~", a case which is not continuous may be included unless "just" or "direct" is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

An electroluminescence display device according to the present disclosure will be described below. In the following description, an example of an electroluminescence display device will be described in detail with reference to the accompanying drawings. In the drawings, the same elements will be referred to by the same reference signs as much as possible.

Figure 1:
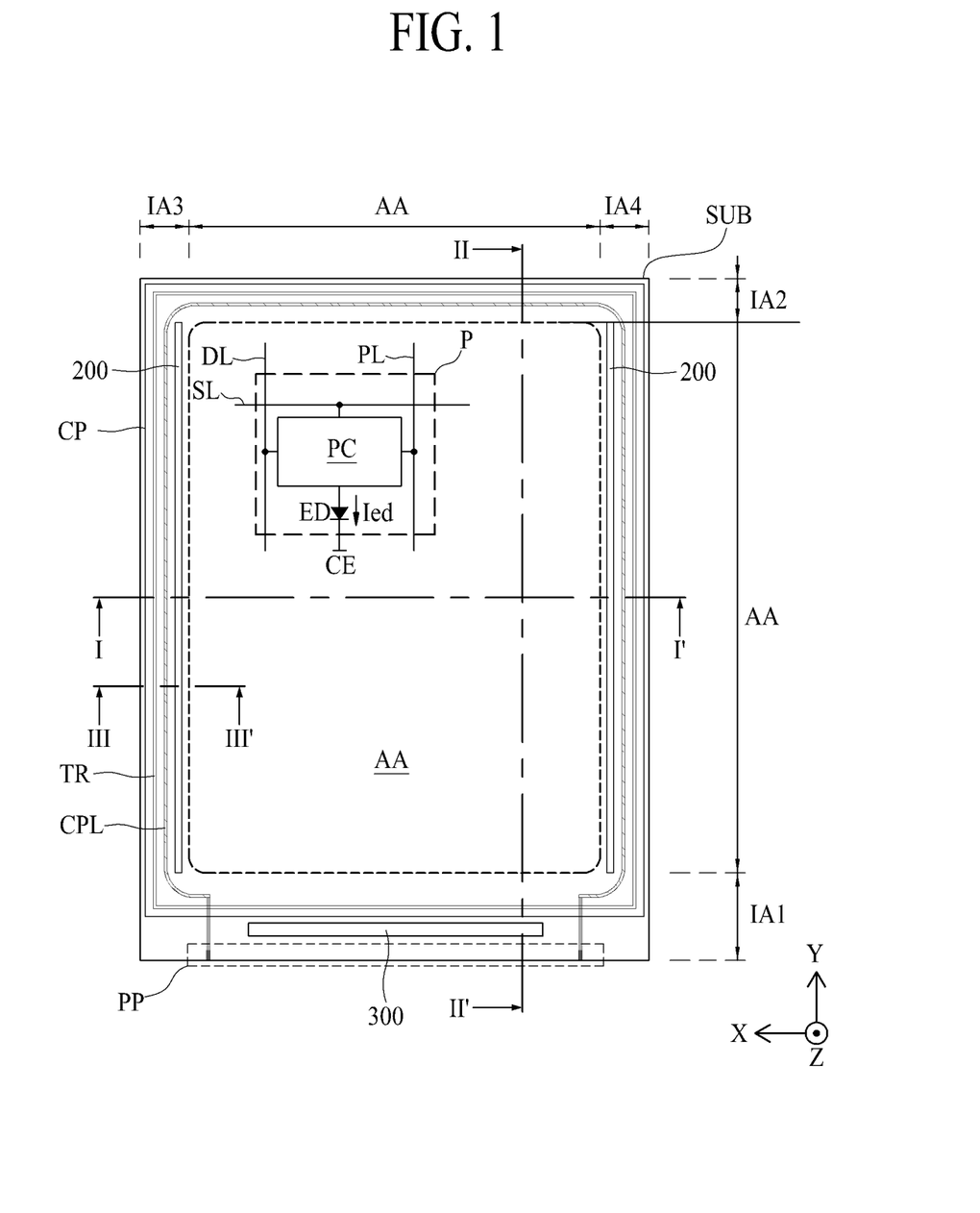
FIG. 1 is a plane view illustrating an electroluminescence display device according to the present disclosure.

FIG. 1 is a plane view illustrating an electroluminescence display device according to the present disclosure. Referring to FIG. 1, an electroluminescence display device according to the present disclosure may include a substrate SUB, a pixel P, a common power line CPL, a gate driving circuit 200, a dam DM and a driving IC 300.

The substrate SUB may include a base board (or a base layer) and may be formed of a plastic material or a glass material. In the case of a foldable display device, the substrate SUB may be made of a plastic material having a high flexibility. However, even it is made of a glass material, the foldable display device may be implemented by making the glass substrate with an ultra-thin thickness.

For example, the substrate SUB two-dimensionally may have a quadrangular shape with round corners with a predetermined radius of curvature, or a non-quadrangular shape with at least six sides. As an example, the substrate SUB having a non-quadrangular shape is disclosed and includes at least one protruding portion or at least one notched portion.

For example, the substrate SUB may be partitioned into a display area AA and a non-display area IA. The display area AA is provided in a substantially middle part of the substrate SUB and is defined as an area for displaying an image. For example, the display area AA has a quadrangular shape, a quadrangular shape of which corners are rounded with a predetermined radius of curvature, or a non-quadrangular shape having at least six sides. Here, the display area AA having a non-quadrangular shape includes at least one protruding portion or at least one notched portion.

The non-display area IA is provided in edges of the substrate SUB to surround the display area AA and is defined as an area in which an image is not displayed or a circumferential area. For example, the non-display area IA includes a first non-display area IA1 that is provided at a first edge of the substrate, a second non-display area IA2 that is provided at a second edge of the substrate SUB which is parallel to the first non-display area IA1, a third non-display area IA3 that is provided at a third edge of the substrate SUB, and a fourth non-display area IA4 that is provided at a fourth edge of the substrate SUB which is parallel to the third non-display area IA3. For example, the first non-display area IA1 may be an upper (or lower) edge area of the substrate SUB, the second non-display area IA2 may be a lower (or upper) edge area of the substrate SUB, the third non-display area IA3 may be a left (or right) edge area of the substrate SUB, and the fourth non-display area IA4 may be a right (or left) edge area of the substrate SUB, but the present disclosure is not limited thereto.

The pixels P are disposed in the display area AA of the substrate SUB. For example, a plurality of pixels may be disposed in a matrix in the display area AA of the substrate SUB. The pixels P are disposed in areas which are defined by scan lines SL, data lines DL, and pixel driving power supply lines PL, respectively.

The scan lines SL extend in a first direction X and are disposed at predetermined intervals in a second direction Y crossing the first direction X. The display area AA of the substrate SUB includes a plurality of scan lines SL that are parallel to each other in the first direction X and are separated from each other in the second direction Y. Here, the first direction X is defined as a horizontal direction of the substrate SUB and the second direction Y is defined as a vertical direction of the substrate SUB, but the present disclosure is not limited thereto and may be defined on the contrary thereto.

The data lines DL extend in the second direction Y and are disposed at predetermined intervals in the first direction X. The display area AA of the substrate SUB includes a plurality of data lines DL that are parallel to the second direction Y and are separated from each other in the first direction X.

The pixel driving power supply lines PL are disposed on the substrate SUB to be parallel to the data lines DL. The display area AA of the substrate SUB includes a plurality of pixel driving power supply lines PL that are parallel to the data lines DL. Selectively, the pixel driving power supply lines PL may be disposed to be parallel to the scan lines SL.

For example, the pixels P may be disposed in a stripe pattern in the display area AA. One-unit pixel includes a red subpixel, a green subpixel, and a blue subpixel, and the unit pixel may further include a white subpixel. The stripe pattern refers to a pattern in which subpixels of the same color are continuously disposed in one row or column and subpixels of different colors are alternately disposed. For example, red subpixels form a first column, green subpixels form a second column, blue subpixels form a third column, and the red column, the green column, and the blue column are repeatedly alternately disposed.

For example, the pixels P may be disposed in a pentile structure in the display area AA. In this case, a unit pixel includes at least one red subpixel, at least two green subpixels, and at least one blue subpixel which are disposed in a two-dimensional polygonal shape. For example, in one unit pixel having a pentile structure, one red subpixel, two green subpixels, and one blue subpixel are two-dimensionally disposed in an octagonal shape. In this case, the blue subpixel has an opening area (or an emission area) which is the largest, and the green subpixel has an opening area which is the smallest.

Each pixel P includes a pixel circuit PC that is electrically connected to the neighboring scan lines SL, the corresponding data line DL, and the corresponding pixel driving power supply line PL and a light emitting element ED that is electrically connected to the pixel circuit PC.

The pixel circuit PC controls the electric data currents Ied flowing from the pixel driving power supply line PL to the light emitting element ED on the basis of a data voltage which is supplied from the data line DL in response to a scan signal which is supplied from at least one scan line SL.

For example, each pixel circuit PC includes at least two thin-film transistors and one capacitor. For example, each pixel circuit PC may include a driving thin-film transistor that supplies a data current Ied based on a data voltage to the light emitting element ED, a switching thin-film transistor that supplies the data voltage supplied from the data line DL to the driving thin-film transistor, and a capacitor that stores a gate-source voltage of the driving thin-film transistor.

For example, each pixel circuit PC may include at least three thin-film transistors and at least one capacitor. For example, the pixel circuit PC includes a current supply circuit, a data supply circuit, and a compensation circuit depending on operations (or functions) of the at least three thin-film transistors. Here, the current supply circuit includes a driving thin-film transistor that supplies a data current Ied based on a data voltage to the light emitting element ED. The data supply circuit includes at last one switching thin-film transistors that supply the data voltage supplied form the data line DL to the current supply circuit in response to at least one scan signal. The compensation circuit includes at least one compensation thin-film transistor that compensates for change in characteristic values (a threshold voltage and/or mobility) of the driving thin-film transistor in response to at least one scan signal.

Each light emitting element ED emits light with luminance corresponding to the data current Ied in response to the data current Ied which is supplied from the pixel circuit PC. In this case, the data current Ied flows from the pixel driving power supply line PL to a common power supply line CPL via the light emitting element ED.

For example, each light emitting element ED may include an inorganic light emitting diode or an organic light emitting diode. For example, each light emitting element ED includes a pixel driving electrode AE (or a first electrode or an anode) that is electrically connected to a pixel circuit PC, a light emitting layer EL that is formed on the pixel driving electrode AE, and a common electrode CE (or a second electrode or a cathode) that is electrically connected to the light emitting layer EL.

The common power supply line CPL is disposed in the non-display area IA of the substrate SUB and is electrically connected to the common electrode CE disposed in the display area AA. For example, the common power supply line CPL is disposed along the second to fourth non-display areas IA2, IA3, and IA4 which are adjacent to the display area AA of the substrate SUB with a constant line width and surrounds parts of the display area AA other than the part adjacent to the first non-display area IA1 of the substrate SUB. One end of the common power supply line CPL is disposed on one side of the first non-display area IA1 and the other end of the common power supply line CPL is disposed on the other side of the first non-display area IA1. One end and the other end of the common power supply line CPL are disposed to surround the second to fourth non-display areas IA2, IA3, and IA4. Accordingly, the common power supply line CPL has two-dimensionally a "∩-shape" in which one side corresponding to the first non-display area IA1 of the substrate SUB is open.

The encapsulation layer is formed on the substrate SUB to surround the display area AA and the non-display area IA. The encapsulation layer serves to prevent oxygen or moisture from permeating the light emitting elements ED which are disposed in the display area AA. For example, the encapsulation layer may include at least one inorganic film or organic film. For example, the encapsulation layer may include a plurality of inorganic films and an organic film interposed between the plurality of inorganic films. For example, the encapsulation layer may be deposited on the surface of the substrate SUB with an organic material including getter (or moisture absorbent).

A driving unit according to an aspect of the present disclosure includes a pad part PP, a gate driving circuit 200, and a driving integrated circuit 300. The pad part PP includes a plurality of pads which are provided in the non-display area IA of the substrate SUB. For example, the pad part PP may include a plurality of common power supply pads, a plurality of data input pads, a plurality of power supply pads, and a plurality of control signal input pads which are provided in the first non-display area IA1 of the substrate SUB.

The gate driving circuit 200 is provided in the third non-display area IA3 and/or the fourth non-display area IA4 of the substrate SUB and is connected to the scan lines SL provided in the display area AA in a one-to-one correspondence manner. The gate driving circuit 200 is formed as an integrated circuit in the third non-display area IA3 and/or the fourth non-display area IA4 of the substrate SUB in the same process as a process of manufacturing the pixels P, that is, a process of manufacturing the thin-film transistors. The gate driving circuit 200 drives a plurality of scan lines SL in a predetermined order by generating a scan signal on the basis of a gate control signal supplied from the driving integrated circuit 300 and outputting the generated scan signals in a predetermined order. For example, the gate driving circuit 200 may include a shift register.

The driving integrated circuit 300 is mounted in a chip mounting area which is defined in the first non-display area IA1 of the substrate SUB through a chip mounting (or bonding) process. Input terminals of the driving integrated circuit 300 are directly connected to the pad part PP and thus a plurality of data lines DL provided in the display area AA are electrically connected to a plurality of pixel driving power supply lines PL. The driving integrated circuit 300 receives various powers, a timing synchronization signal, and digital image data from a display driving circuit unit (or a host circuit) via the pad part PP, generates gate control signals on the basis of the timing synchronization signal, controls driving of the gate driving circuit 200, converts the digital image data into analog pixel data voltages, and supplies the analog pixel data voltages to the corresponding data lines DL.

Hereinafter, referring to cross-sectional views illustrating the structural features of the present disclosure, various aspects will be described.

<First Aspect>

Figure 2:
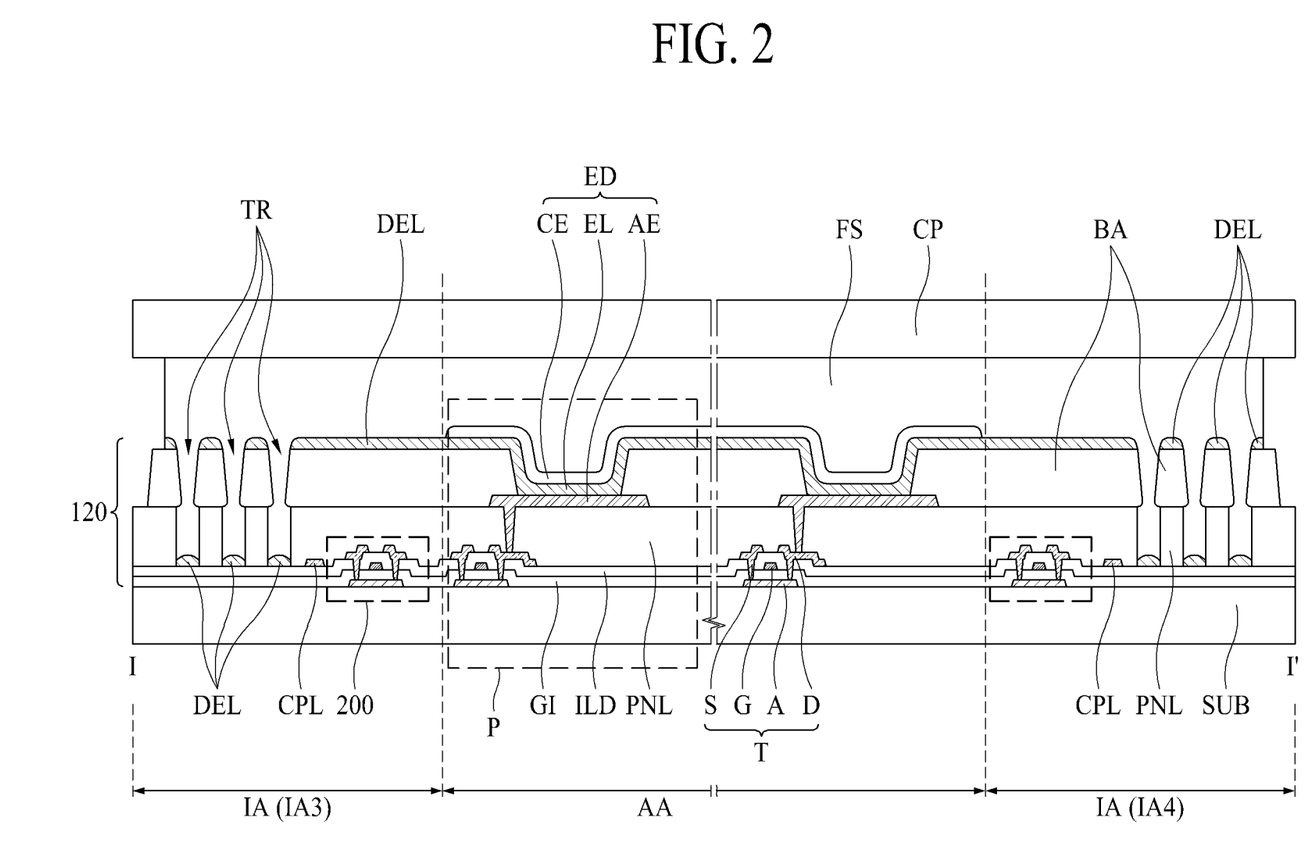
FIG. 2 is a cross-sectional view, along cutting line I-I' in FIG. 1, illustrating a structure of the electroluminescence display device according to a first aspect of the present disclosure.

Hereinafter, referring to FIG. 2, the first aspect of the present disclosure will be described as follows. FIG. 2 is a cross-sectional view, along cutting line I-I' in FIG. 1, illustrating a structure of the electroluminescence display device according to the first aspect of the present disclosure.

An electroluminescence display device according to the first aspect of the present disclosure may include a substrate SUB, a pixel array layer 120, an encapsulation layer FS and a cover plate CP.

The substrate SUB as a base layer may be made of a plastic material or a glass material. The substrate SUB may include an opaque or a colored polyimide material. For example, the substrate SUB of the polyimide may be a hardened polyimide resin layer which is coated with a predetermined thickness on a release layer disposed on the front surface of the carrier glass substrate relatively thicker than the polyimide substrate SUB. In this case, the carrier glass substrate and the substrate SUB of the polyimide may be separated from each other by a release process using laser. In that case, the substrate SUB may further include a back plate attached on the rear surface of the substrate SUB in the thickness direction (Z-axis). The back plate is for sustaining the substrate SUB in a flat plane condition. For example, the back plate may include a plastic material such as the polyethylene terephthalate material. The back plate may be laminated at the rear surface of the substrate SUB released from the carrier glass substrate.

In an aspect where the substrate SUB is a glass substrate, the glass substrate SUB may be a thin glass substrate having a thickness less than about 100 micrometers. In another aspect where the glass substrate SUB is a carrier glass substrate, the carrier glass substrate may have a thickness that is etched to be less than about 100 micrometers. These thinned glass substrates may have flexibility.

The substrate SUB may include a display area AA and a non-display area IA surrounding the display area AA. On the upper surface of the substrate SUB, a buffer layer (not shown) may be disposed. For preventing moisture or other external foreign materials from penetrating into the pixel array layer 120 through the substrate SUB, the buffer layer may be deposited on the upper surface of the substrate SUB. The buffer layer may include a plurality of the inorganic layers. For example, the buffer layer may include a plurality of layers of a silicon oxidation (SiOx) layer, a silicon nitride (SiNx) layer and a silicon nitro-oxidation (SiON) layer that are alternatively stacked. The buffer layer may be omitted in some cases depending upon device designs.

The pixel array layer 120 may include a thin film transistor layer, a planarization layer PL, a bank BA and a light emitting element ED.

The thin film transistor layer may be formed at the display area AA where the pixels P are disposed and at the gate driver 200 located at the fourth non-display area IA4 of the substrate SUB.

For example, the thin film transistor layer may include a thin film transistor T, a gate insulating layer GI and an intermediate insulating layer ILD. Here, the thin film transistor T shown in FIG. 2 may be a driving thin film transistor electrically connected to the light emitting element ED.

The thin film transistor T may include a semiconductor layer A disposed on the substrate SUB or the buffer layer, a gate electrode G, a source electrode S and a drain electrode D. In FIG. 2, the thin film transistor T has the top gate structure in which the gate electrode G is disposed over the semiconductor layer A, but it is not restricted thereof. For another example, the thin film transistor T may have the bottom gate structure in which the gate electrode G is disposed under the semiconductor layer A. Otherwise, the thin film transistor T may have the double gate structure in which the upper and bottom gate electrodes G are disposed at upper and bottom sides of the semiconductor layer A, respectively.

The semiconductor layer A may be formed on the substrate SUB. The semiconductor layer A may include a silicon type semiconductor material, an oxidation semiconductor material or an organic semiconductor material, and may have a single layer structure or a multi-layer structure. Between the buffer layer and the semiconductor layer A, a light shielding layer may be further included to block the external light into the semiconductor A.

The gate insulating layer GI may be deposited on the substrate SUB as covering the semiconductors A. The gate insulating layer GI may include an inorganic layer such as a silicon oxidation (SiOx) layer, a silicon nitride layer (SiNx) and a multi-layer thereof.

The gate electrode G may be formed on the gate insulating layer GI as overlapping with the semiconductor layer A. The gate electrode G may be formed with the scan line SL. Even though not shown in figures, the common power line CPL may be formed with the gate electrode G and the scan line SL. For example, the gate electrode G may be formed as a single layer or a multiple layer including one of molybdenum (Mo), aluminum (Al), chrome (Cr), gold (Au), the titanium (Ti), nickel (Ni), neodymium (Nd) and copper (Cu) or alloy thereof.

The intermediate insulating layer ILD may be deposited on the substrate SUB as covering the gate electrode G and the gate insulating layer GI. The intermediate insulating layer ILD may provide the flat surface on the substrate having the gate electrode G and the gate insulating layer GI.

The source electrode S and the drain electrode D are formed on the intermediate insulating layer ILD as connecting to the one side and the other side of the semiconductor layer, respectively. The source electrode S and the drain electrode D may be formed with the data line DL, the pixel driving power line PL and the common power line CPL. For example, the source electrode S, the drain electrode D, the data line DL, the pixel driving power line PL and the common power line CPL are simultaneously formed by the patterning process after coating the source-drain material thin layer.

The source electrode S and the drain electrode D are connected to the semiconductor layer A through the contact holes penetrating the intermediate insulating layer ILD and the gate insulating layer GI, respectively. The source electrode S and the drain electrode D may be formed as the single layer or the multiple layer including the molybdenum (Mo), the aluminum (Al), the chrome (Cr), the gold (Au), the titanium (Ti), the nickel (Ni), the neodymium (Nd) or copper (Cu) or alloy thereof. Here, the source electrode S of the thin film transistor T shown in FIG. 2 may be electrically connected to the pixel driving power line PL.

The thin film transistor T disposed at the pixel P of the substrate SUB may be included in the pixel circuit PC. The gate driver 200 disposed at the fourth non-display area IA4 of the substrate SUB may include the thin film transistors that is substantially the same with or similar with the thin film transistor T disposed in the pixel P.

The planarization layer PLN may be deposited on the whole surface of the substrate SUB including display area AA and the non-display area IA as covering the thin film transistor layer. The planarization layer PLN provides a flat surface condition over the thin film transistor layer. For example, the planarization layer PLN may be made of the organic layer such as the acryl resin, the epoxy resin, the phenolic resin, the polyamide resin or the polyimide resin.

For another example, the planarization layer PLN may include a pixel contact hole for exposing some of the drain electrode D of the thin film transistor T disposed in the pixel P.

Disposed on the planarization layer PL, the bank BA may define the aperture area (or emission area) within the pixel P of the display area AA. The bank BA may be called as a pixel definition layer.

The light emitting element ED may include a pixel driving electrode AE, a light emitting layer EL and a common electrode CE. The pixel driving electrode AE may be formed on the planarization layer PL, and electrically connected to the drain electrode D of the driving thin film transistor through the pixel contact hole formed at the planarization layer PL. In this case, the bank BA may cover the circumferential portions of the pixel driving electrode AE excepting the middle portions of pixel driving electrode AE overlapping with the aperture area of the pixel P. The bank BA may define the aperture area by covering the circumferential portions of the pixel driving electrode AE.

The pixel driving electrode AE may include a metal material having relatively high reflective index. For example, the pixel driving electrode AE may have a multi-layer structure such as a stacked structure (Ti/Al/Ti) of the aluminum (Al) and the titanium (Ti), a stacked structure (ITO/Al/ITO) of the aluminum (Al) and the ITO (Indium Thin Oxide), the APC (Ag/Pd/Cu) alloy and a stacked structure (ITO/APC/ITO) of ACP alloy and the ITO, or a single layer structure including at least selected one of silver (Ag), aluminum (Al), molybdenum (Mo), gold (Au), magnesium (Mg), calcium (Ca) or barium (Ba). Other structure can be utilized and the present disclosure is not limited to the aforementioned structures.

The light emitting layer EL may be deposited on the display area AA of the substrate SUB as covering the pixel driving electrode AE and the bank BN. The light emitting layer EL may include at least two emission portions vertically stacked in order to emit the white color light. For example, the light emitting layer EL may include a first emission portion and a second emission portion in order to emit the white color light by combining a first light from the first emission portion and a second light from the second emission portion. Here, the first emission portion for emitting the first light may include a blue emission portion, a green emission portion, a red emission portion, a yellow emission portion and a yellowish green emission portion. The second emission portion may include any selected one of a blue emission layer, a green emission layer, a red emission layer, a yellow emission layer and a yellowish green emission layer for emitting the second light which can optically compensate the first light.

For another aspect, the light emitting layer EL may include any one of the organic emission layer, the inorganic emission layer and a quantum dot emission layer, a stacked layer of the organic emission layer (or inorganic emission layer) and the quantum dot emission layer, or any combination structure thereof. In addition, the light emitting element ED may further include a functional layer for enhancing the light emitting efficiency, the lifetime of the light emitting layer EL.

The common electrode CE may electrically be connected to the light emitting layer EL. The common electrode CE may be formed on the display area AA of the substrate SUB as commonly connecting to the light emitting layer EL disposed at the pixel P.

For example, the common electrode CE may have a transparent conductive material or a semi-transparent conductive material. In the case that the common electrode CE has the semi-transparent conductive material, the micro-cavity structure may be applied to enhance the emission efficiency of the light emitting element ED. In one example, the semi-transparent conductive material may be selected one of magnesium (Mg), silver (Ag) and an alloy of the magnesium (Mg) and silver (Ag). On the common electrode CE, a capping layer may be further formed for enhancing the light emission efficiency by controlling the refractive index of the light emitted from the light emitting element ED.

The encapsulation layer FS may be formed on the upper surface of the pixel array layer 120 as covering the display area AA and the non-display area IA. The encapsulation layer FS has the function for preventing the oxygen or moisture from penetrating into the light emitting element ED.

For example, the encapsulation layer FS may comprise a base material including an organic material such as silicon oxy-carbon (SiOCz) acryl or a resin of epoxy family, and a getter material scattered in the base material for absorbing the moisture or gas. The encapsulation layer FS may be formed by the coating process such as the ink-jet coating process or the slit coating process.

The cover plate CP may be disposed over the encapsulation layer FS. For example, the encapsulation layer FS may include an adhesive material and moisture absorbents dispersed into the adhesive material. The cover plate CP may be attached on the upper surface of the encapsulation layer FS. The cover plate CP may have a size corresponding to or being less than the size of the substrate SUB. For example, the cover plate CP may have a smaller size than the substrate SUB in order to expose the driving IC 300 disposed on the first non-display area IA1.

Referring to FIG. 2, the electroluminescence display device according to the first aspect may include a substrate SUB on which a third non-display area IA3, a display area AA and a fourth non-display area IA4 are defined. A plurality of pixels may be arrayed in the display area AA. Each of pixel may include a thin film transistor T and a light emitting element ED. The thin film transistor T may be a driving thin film transistor for driving the light emitting element ED.

The light emitting element ED may include a pixel driving electrode AE, a light emitting layer EL and a common electrode CE which are sequentially stacked within the emission area defined by the bank BA. The light emitting layer EL may be deposited over the all area of the display area AA. The light emitting layer EL may be deposited over the non-display area IA particularly including the third non-display area IA3 and the fourth non-display area IA4. In detail, the light emitting layer EL may be disposed as which the end edge of the light emitting layer EL is aligned or flush with or corresponds to the end edge of the encapsulation layer FS in the non-display area IA. Here, the portion of the light emitting layer EL extended from the display area AA to the non-display area IA may be defined as a dummy light emitting layer DEL. The dummy light emitting layer DEL cannot actually emit lights because there is no electrode at upper and lower portions of the dummy light emitting layer DEL, so the term of 'dummy' is used.

In the non-display area IA such as the third non-display area IA3 and the fourth non-display area IA4, a plurality of trenches TR may be formed. The trenches TR may be disposed as forming a closed curve shape surrounding the display area AA. The trenches TR may be formed by patterning the planarization layer PLN and the bank BA at the same time.

Figure 3:
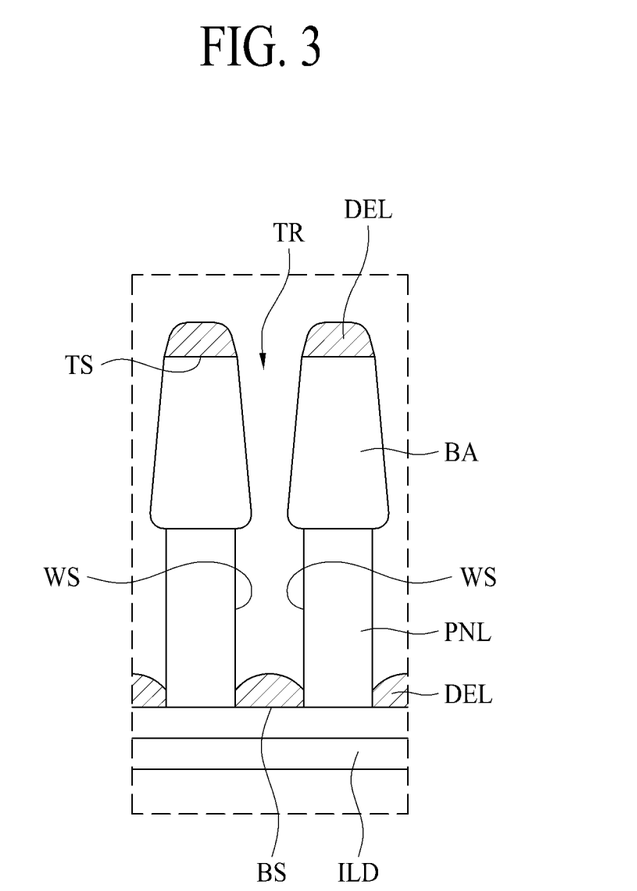
FIG. 3 is an enlarged cross-sectional view illustrating a structure of a trench included in the electroluminescence display device according to the present disclosure.

The dummy light emitting layer DEL disposed in the non-display area IA may have a disconnected structure by the trenches TR. Hereinafter, referring to FIG. 3, the structure of trench will be explained in detail. FIG. 3 is an enlarged cross-sectional view illustrating a structure of a trench included in the electroluminescence display device according to the present disclosure.

Referring to FIG. 3, a trench may have a well shape including a top surface TS, a bottom surface BS and a wall surface WS. The top surface may be an upper surface of the bank BA. The bottom surface BS may be an upper surface of the intermediate insulating layer ILD exposed by the trench TR. The wall surface WS may be an etched side wall surface of the bank BA and the planarization layer PL. The end edge of the trench TR may be apart from the end edge of the encapsulation layer FS into the display area AA with a predetermined distance. For example, the outermost wall surface WS of the trench TR may be disposed as being apart from the end edge of the encapsulation layer FS into the display area AA with a predetermined distance.

The dummy light emitting layer DEL may not be deposited as following the highly stepped profile of the trenches TR, but be deposited on the top surface TS and the bottom surface BS only. That is, the dummy light emitting layer DEL may not be deposited on the wall surface WS. Therefore, the dummy light emitting layer DEL may be disconnected by the trenches TR and have a plurality of separated parts. As the result, when any foreign materials such as the moistures or gases are intruded into the exposed end of the dummy light emitting layer DEL at the end edge of the encapsulation layer TS, the foreign materials may not be propagated along the dummy light emitting layer DEL into the display area AA. Particularly, as a plurality of trenches TR are arranged one after another with a gap between each of them, the intruded foreign materials may be blocked and not be propagated through the dummy light emitting layer DEL. Even if the foreign materials may be propagated, the speed of propagation may be extremely lowered.

The method for manufacturing the electroluminescence display device according to the first aspect will be briefly described. After forming the bank BA and then patterning the trenches TR, the light emitting layer EL and the dummy light emitting layer DEL may be disposed on the substrate SUB by depositing the organic light emitting material. At this time, without any mask, the organic light emitting material may be deposited on the substrate SUB as covering the whole surfaces of the display area AA and the non-display area IA.

After depositing the light emitting layer EL and the dummy light emitting layer DEL on the whole surface of the substrate SUB, the common electrode CE may be formed and then the encapsulation layer FS may be deposited. After that, the cover plate CP may be attached on the upper surface of the encapsulation layer FS.

Then, the exposed portions of the dummy light emitting layer DEL from outside of the encapsulation layer FS may be removed. Accordingly, the dummy light emitting layer DEL may have a structure in which the end edges are aligned or flush with the end edges of the encapsulation layer FS.

Like this, as the light emitting layer EL and the dummy light emitting layer DEL are deposited without any mask, it is not necessary to consider the marginal area at the non-display area IA for aligning the mask with the substrate SUB. As the result, the area of the non-display area IA may be further reduced by the marginal area of the mask. Therefore, the present disclosure may provide an electroluminescence display device having an ultra-narrow bezel structure.

Figure 4:
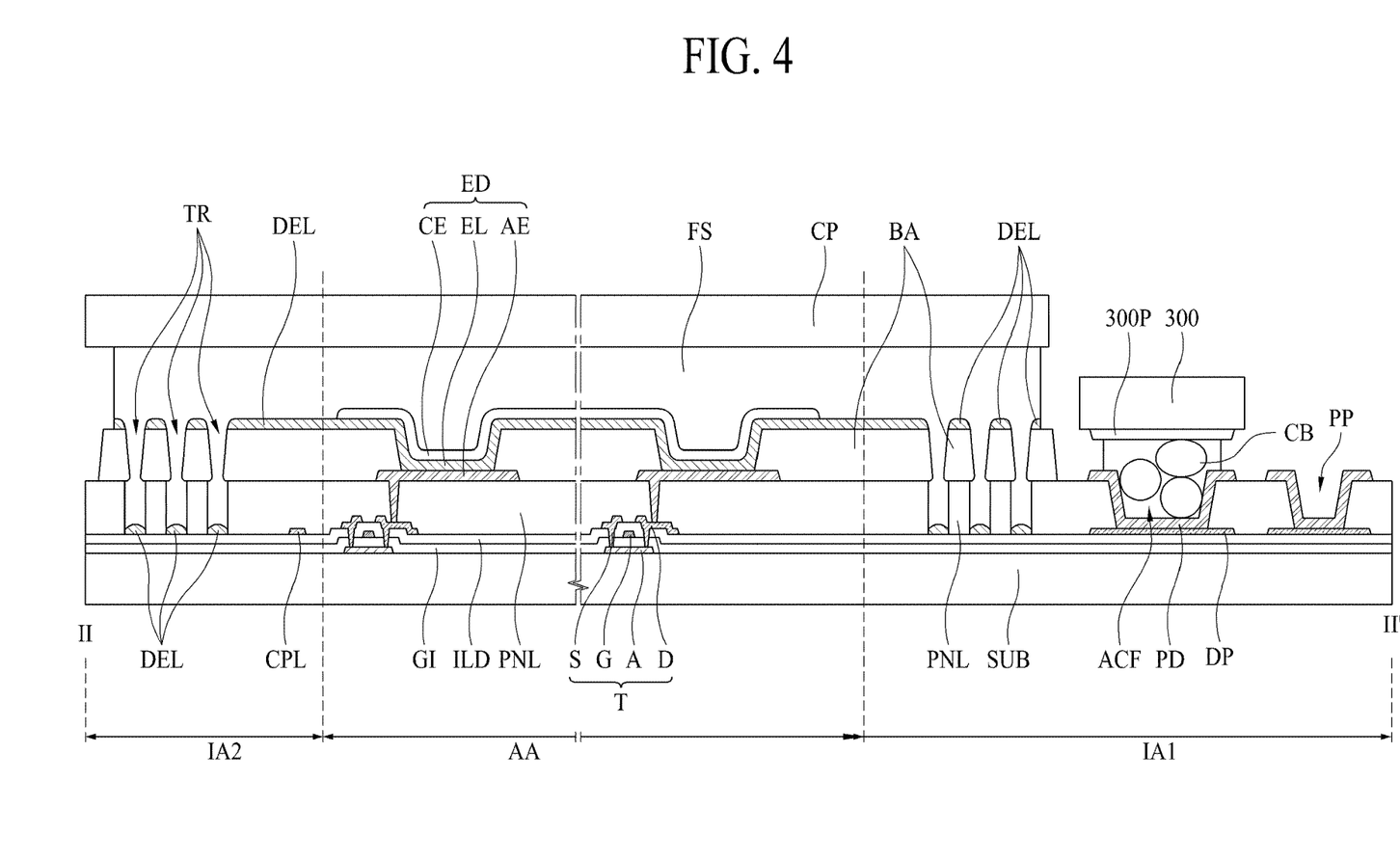
FIG. 4 is a cross-sectional view, along cutting line II-II' in FIG. 1, illustrating a structure of the electroluminescence display device according to the first aspect of the present disclosure.

Hereinafter, referring to FIG. 4, a cross-sectional structure of the portion where the driving integrated circuit 300 is disposed in the electroluminescence display device according to the first aspect will be described. FIG. 4 is a cross-sectional view, along cutting line II-II' in FIG. 1, illustrating a structure of the electroluminescence display device according to the first aspect of the present disclosure.

The cross-sectional structure illustrated in FIG. 4 may be similar with the structure shown in FIG. 2. In addition to the structure in FIG. 2, the driving integrated circuit 300 and the pad portion PP are further included in FIG. 4. The same configuration may not be explained.

Referring to FIG. 4, the second non-display area IA2 may have the same structure of the third non-display area IA3 or the fourth non-display area IA4 shown in FIG. 2. However, the first non-display area IA1 further includes the driving integrated circuit 300 and the pad portion PP disposed outside the encapsulation layer FS and the cover plate CP.

The encapsulation layer FS and the cover plate CP may be extended just before the driving integrated circuit 300 and the pad portion PP. That is, the driving integrated circuit 300 and the pad portion PP can be disposed on the substrate, and the outer portion of the first non-display area IA1 does not overlap with the encapsulation layer FS and the cover plate CP.

The driving integrated circuit 300 may be connected to the data pad DP disposed at the end of the data line. For example, the data pad DP may be disposed at the same layer with the source electrode S and the drain electrode D of the thin film transistor T. Particularly, the data pad DP may be disposed at the end of the data line DL linking the source electrode S. the data pad DP may be covered by the planarization layer PNL. The data pad DP may be exposed from the contact hole formed at the planarization layer PNL, and connected to the pad terminal PD made of the same material with the pixel driving electrode AE. The pad terminal PD connected to the data pad DP may be connected to the driving integrated circuit 300. For example, the driving integrated circuit 300 may include a connection pad 300P. An anisotropic conductive film ACF may be placed between the pad terminal PD and the connection pad 300P and the driving integrated circuit 300 may be pressed downward by an external force to attach them together. Accordingly, the pad terminal PD and the connection pad 300P may be electrically connected through the conductive ball CB dispersed into the anisotropic conductive film ACF.

The pad portion PP may be disposed outside of the driving integrated circuit 300. The pad portion PP may be exposed so as to be connected to the external device. For example, the pad portion PP may be connected to the circuit device such as the FPCB (or Flexible Printed Circuit Board).

In the first aspect, as the light emitting layer EL may be deposited without using a mask, the gap between the driving integrated circuit 300 and the cover substrate CP may be formed to be very close. In the related method of using a mask for depositing the light emitting layer EL, the light emitting layer EL should be deposited within the display area AA only. In that case, the processing marginal area for aligning and placing the mask should be considered, so the non-display area IA should have an enough size for keeping the marginal area. However, in this present disclosure, the non-display area IA can have the minimized size because any mask is required.

<Second Aspect>

Figure 5:
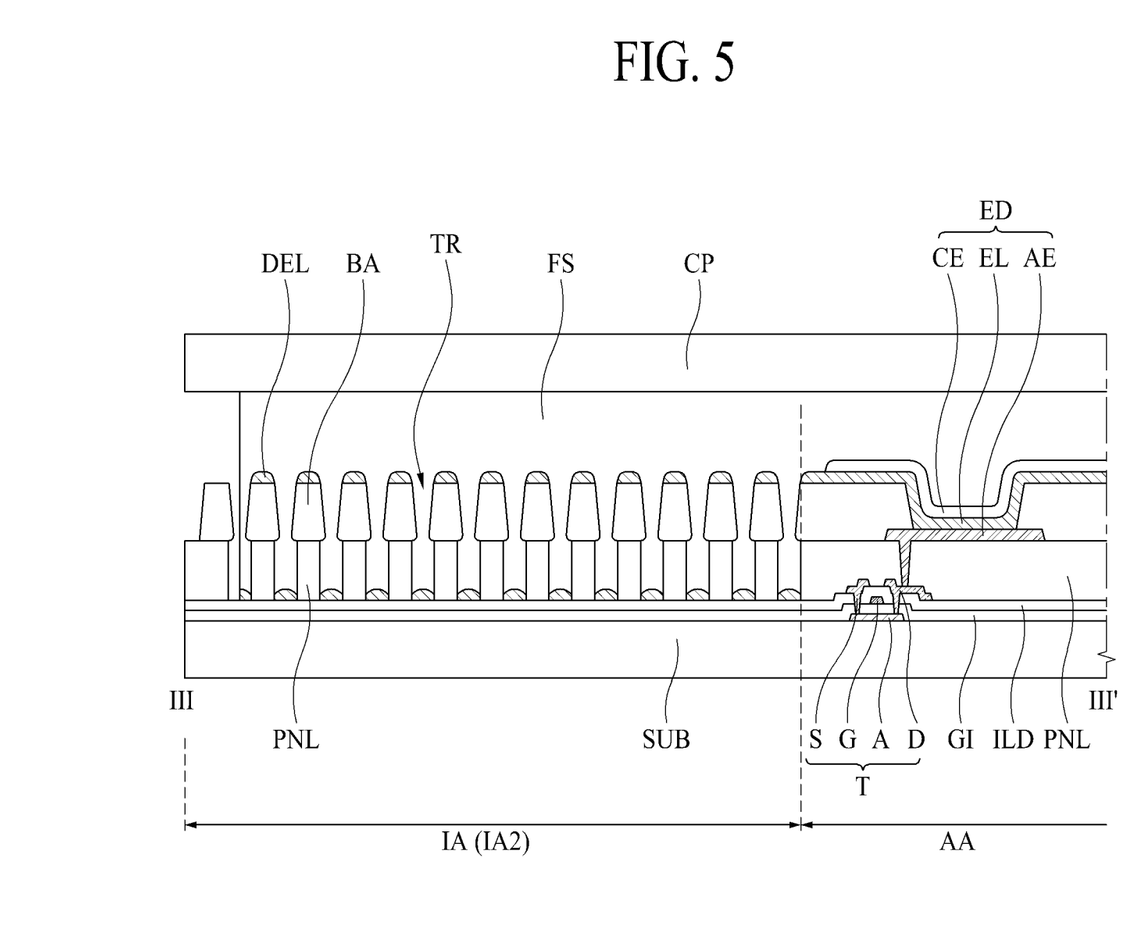
FIG. 5 is a cross-sectional view, along cutting line III-III' in FIG. 1, illustrating a structure of the electroluminescence display device according to a second aspect of the present disclosure.

Hereinafter, referring to FIG. 5, the second aspect will be described. In the second aspect, the explanation will be focusing on the arrangement structure of the trenches. FIG. 5 is a cross-sectional view, along cutting line III-III' in FIG. 1, illustrating a structure of the electroluminescence display device according to the second aspect of the present disclosure.

The electroluminescence display device according to the second aspect as shown in FIG. 5 may have a similar structure with the first aspect. The difference point may be on the arrangement of the trenches TR. Referring to FIG. 5, the electroluminescence display device according to the second aspect may comprise a display area AA and a non-display area IA surrounding the display area AA on a substrate SUB. The display area AA may include a thin film transistor T and a light emitting element ED.

The light emitting element ED may include a pixel driving electrode AE, an light emitting layer EL and a common electrode CE. Particularly, the pixel driving electrode AE may be defined by the bank BA. The light emitting layer EL and the common electrode CE may be commonly deposited over the whole surface of the display area AA. The light emitting element ED may be formed at the stacked portion of the pixel driving electrode AE, the light emitting layer EL and the common electrode CE in the emission area defined by the bank BA.

The light emitting layer EL may cover the display area AA as well as the non-display area IA. Particularly, the light emitting layer EL may be extended to the end edge of the encapsulation layer FS. In another word, the light emitting layer EL may be extended from the display area AA to the non-display area IA in which the end edge may be aligned (or flush) with or coincide with the end edge of the encapsulation layer FS.

In the non-display area IA, a plurality of trenches TR are disposed one after another. The trenches TR may have a wall shape formed by etching the bank BA and the planarization layer PNL. Particularly, adjusting the etching ratio of the bank BA and the planarization layer PNL to the etchant, the planarization layer PNL may have an under-cut shape by over-etching the planarization layer PNL than the bank BA. However, it is not limited thereto. For another example, the trenches TR may be formed by etching the planarization layer PNL only. As the trenches TR are formed for making the light emitting layer EL having a disconnected structure, the second aspect may provide more effective structure for disconnection.

The light emitting layer EL may be deposited on the bank BA after forming the trenches TR. Therefore, the light emitting layer EL may be formed as one layer continuously deposited over the display area AA. However, in the non-display area IA, the light emitting layer EL may be deposited on the top surface and the bottom surface of the trench TR excepting the wall surface. As the result, the light emitting layer EL may be formed as separated layers discontinuously deposited over the non-display area IA.

As the light emitting layer EL deposited in the non-display area IA has the separated structure, this may be called as a 'dummy light emitting layer DEL'. Even though the dummy light emitting layer DEL has the same material with the light emitting layer EL forming the light emitting element ED in the display area AA, the dummy light emitting layer DEL may not have the light emitting function in the non-display area IA, because it is separated and there is no electrode at upper side and lower side.

The encapsulation layer FS may cover the trenches TR. FIG. 5 illustrates the case in which the end edge of the encapsulation layer FS is set at the middle portion of the outermost trench TR. However, it is not limited thereto, the end edge of the encapsulation layer FS may be set on the second trench TR from the outmost. Otherwise, as shown in FIG. 5, the end edge of the encapsulation layer FS may be set on the bottom surface between any two neighboring trenches TR. In that case, the end edge of the trench TR is apart from the end edge of the encapsulation layer FS to an end edge of the substrate SUB with a predetermined distance. For example, the outermost wall surface WS of the trench TR may be disposed as being apart from the end edge of the encapsulation layer FS to an end edge of the substrate SUB with a predetermined distance. The end edge of the encapsulation layer FS may be overlapped with the trench TR (as shown in FIG. 5) or may cover the trench TR (shown in FIG. 4).

The cover plate CP may be attached on the encapsulation layer FS. The cover plate CP may have a size slightly wider than the area of the encapsulation layer FS. For example, the cover plate CP have a shape, in which the end edges are aligned (or flush) with or coincide with the end edges of the substrate SUB excepting the fourth non-display area IA4 where the driving integrated circuit 300 is disposed.

In viewpoint of the manufacturing process, after attaching the cover plate CP on the encapsulation layer FS, the exposed portions of the light emitting layer EL came out of the encapsulation layer FS are removed. As the result, the end edges of the encapsulation layer FS may be aligned (or flush) with or coincided with the end edges of the light emitting layer, particularly end edges of the dummy light emitting layer DEL.

In the second aspect, when the light emitting layer EL may be deposited without using a mask, the light emitting layer EL may become the dummy light emitting layer DEL separated into a plurality of parts. As the result, when any foreign materials such as the moistures or gases are intruded into the exposed end of the dummy light emitting layer DEL at the end edge of the encapsulation layer TS, the foreign materials may not be propagated along the dummy light emitting layer DEL into the display area AA. Even if the foreign materials may be propagated, the speed of propagation may be extremely lowered because that a plurality of trenches TR are arranged one after another with a gap between each of them. In addition, during the propagating through the dummy light emitting layer DEL, the foreign materials may be adsorbed by the adsorbents included into the encapsulation layer FS so the foreign materials cannot be reached to the display area AA.

The electroluminescence display device according to the second aspect may have a structure in which the non-display area IA may occupy the minimized area in the substrate. In addition, the electroluminescence display device according to the second aspect may have a structure that suppressed the penetration and propagation of the moisture and gas from the outside, almost completely.

<Third Aspect>

Figure 6:
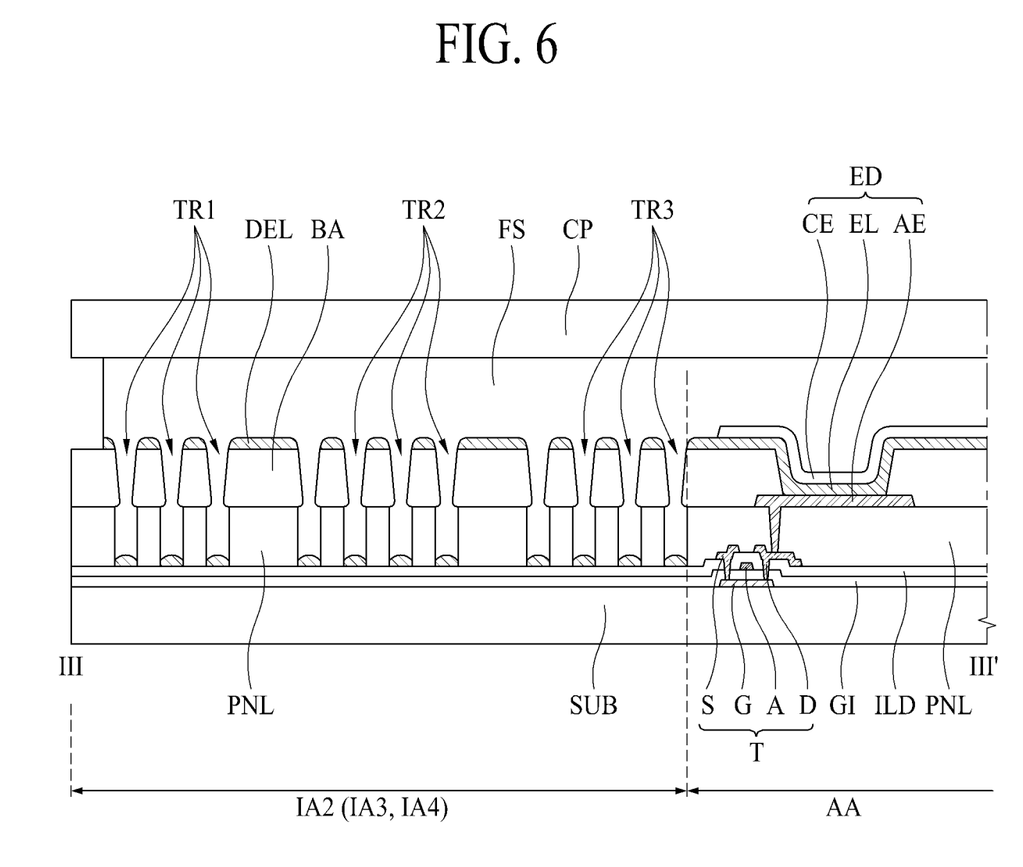
FIG. 6 is a cross-sectional view, along cutting line III-III' in FIG. 1, illustrating a structure of the electroluminescence display device according to a third aspect of the present disclosure.

Hereinafter, referring to FIG. 6, the third aspect will be described. In the third aspect, the explanation will be focused on the arrangement structure of the trenches. FIG. 6 is a cross-sectional view, along cutting line III-III' in FIG. 1, illustrating a structure of the electroluminescence display device according to the third aspect of the present disclosure. FIG. 6 is an enlarged cross-sectional view illustrating the left portions of FIG. 2.

The electroluminescence display device according to the third aspect as shown in FIG. 6 may have a similar structure with the second aspect. The difference point may be on the arrangement of the trenches TR. Referring to FIG. 6, the electroluminescence display device according to the third aspect may comprise a display area AA and a non-display area IA surrounding the display area AA on a substrate SUB. The display area AA may include a thin film transistor T and a light emitting element ED.

In the non-display area IA, a plurality of trenches TR are disposed one after another. The trenches TR may have a wall shape formed by etching the bank BA and the planarization layer PNL. Particularly, adjusting the etching ratio of the bank BA and the planarization layer PNL to the etchant, the planarization layer PNL may have an under-cut shape by over-etching the planarization layer PNL than the bank BA.

Particularly, the trenches TR may have a plurality of groups separated each other. For example, the trenches TR may include a first trench group TR1, a second trench group TR2 and a third trench group TR3. Each trench group TR1, TR2 and TR3 may have at least one trench TR. FIG. 6 shows that there are three trenches TR in each trench groups TR1, TR2 and TR3. However, it is not limited thereto. Each trench groups TR1, TR2 and TR3 may include one trench or two trenches, otherwise more trenches.

The light emitting layer EL may be deposited on the bank BA after forming the trenches TR. Therefore, the light emitting layer EL may be formed as one layer continuously deposited over the display area AA. However, in the non-display area IA, the light emitting layer EL may be deposited on the top surface and the bottom surface of the trench TR excepting the wall surface. As the result, the light emitting layer EL may be formed as separated layers discontinuously deposited over the non-display area IA.

As the light emitting layer EL deposited in the non-display area IA has the separated structure, this may be called as a 'dummy light emitting layer DEL'. Even though the dummy light emitting layer DEL has the same material with the light emitting layer EL forming the light emitting element ED in the display area AA, the dummy light emitting layer DEL may not have the light emitting function in the non-display area IA, because it is separated and there is no electrode at upper side and lower side.

The encapsulation layer FS may be deposited as covering the whole of the trench groups TR1, TR2 and TR3. FIG. 6 illustrates that the end edge of the encapsulation layer FS is set as to extended to the edge of the substrate SUB as covering the first trench group TR1 disposed at the outermost position. However, it is not limited thereto. The end edge of the encapsulation layer FS may be overlapped with the first trench group TR1. For example, the end edge of the encapsulation layer FS may be overlapped with the first trench group TR1, or may cover all trench groups TR1, TR2 and TR3.

The cover plate CP may be attached on the encapsulation layer FS. In viewpoint of the manufacturing process, after attaching the cover plate CP on the encapsulation layer FS, the exposed portions of the light emitting layer EL came out of the encapsulation layer FS are removed. As the result, the end edges of the encapsulation layer FS may be aligned (or flush) with or coincided with the end edges of the light emitting layer, particularly end edges of the dummy light emitting layer DEL.

In the third aspect, when the light emitting layer EL may be deposited without using a mask, the light emitting layer EL may become the dummy light emitting layer DEL separated into a plurality of parts. As the result, when any foreign materials such as the moistures or gases are intruded into the exposed end of the dummy light emitting layer DEL at the end edge of the encapsulation layer TS, the foreign materials may not be propagated along the dummy light emitting layer DEL into the display area AA.

The electroluminescence display device according to the third aspect may have a structure in which the non-display area IA may occupy the minimized area in the substrate. In addition, the electroluminescence display device according to the third aspect may have a structure that suppressed the penetration and propagation of the moisture and gas from the outside, almost completely.

In addition to the above-mentioned advantageous effects of the present disclosure, other features and advantages of the present disclosure will be clearly understood by those skilled in the art from the above description or explanation. Furthermore, features, structures, effects and so on exemplified in at least one example of the present disclosure may be implemented by combining or modifying other examples by a person having ordinary skilled in this field. Therefore, contents related to such combinations and modifications should be interpreted as being included in the scope of the present application.

While aspects of the present disclosure have been described above in detail in conjunction with the accompanying drawings, the present disclosure is not limited to the aspects and can be modified and implemented in various forms without departing from the technical spirit of the present disclosure. Accordingly, the aspects disclosed in the present disclosure are not for limiting the technical spirit of the present disclosure but for explaining it, and the scope of the technical spirit of the present disclosure is not limited by the aspects. Therefore, the above-mentioned aspects should be understood to be exemplary, not definitive, in all respects. The scope of the present disclosure should be defined by the appended claims, and all the technical spirits in equivalent ranges thereof should be construed to belong to the scope of the present disclosure.

What is claimed is:

1. An electroluminescence display device comprising:
   a substrate including a display area and a non-display area surrounding the display area;
   a plurality of pixels disposed in the display area;
   a thin film transistor disposed in the plurality of pixels;
   a planarization layer covering the thin film transistor;
   a light emitting diode including an anode electrode, a light emitting layer and a cathode electrode and disposed on the planarization layer;
   a plurality of trenches disposed at the planarization layer in the non-display area;
   a dummy light emitting layer disposed in the non-display area and extended from the light emitting layer;
   an encapsulation layer covering the display area and the non-display area; and
   a cover plate disposed on the encapsulation layer.

2. The electroluminescence display device according to the claim 1, wherein an end edge of the dummy light emitting layer is aligned with an end edge of the encapsulation layer.

3. The electroluminescence display device according to the claim 1, wherein an end edge of the trench is apart from an end edge of the encapsulation layer into the display area with a predetermined distance.

4. The electroluminescence display device according to the claim 1, wherein an end edge of the trench is apart from an end edge of the encapsulation layer to an end edge of the substrate with a predetermined distance.

5. The electroluminescence display device according to the claim 1, wherein the trench has a top surface, a bottom surface and a wall surface connecting the top surface and the bottom surface, and
   wherein the dummy light emitting layer is disposed on the top surface and the bottom surface excepting for the wall surface.

6. The electroluminescence display device according to the claim 1, wherein the plurality of trenches is disposed with a predetermined distance between an end edge of the substrate and an end edge of the display area.

7. The electroluminescence display device according to the claim 1, wherein the plurality of trenches is divided into a plurality of trench groups between an end edge of the substrate and an end edge of the display area.

8. The electroluminescence display device according to the claim 7, wherein each trench group includes a plurality of trenches.

9. A electroluminescence display device comprising:
   a substrate including a display area and a non-display area surrounding the display area;
   a plurality of pixels disposed in the display area;
   a planarization layer covering the display area and the non-display area;
   an anode electrode disposed in the plurality of pixels on the planarization layer;
   a bank defining an emission area of the anode electrode on the planarization layer;
   a plurality of trenches disposed at the planarization layer and the bank and disposed in the non-display area as surrounding the display area;
   a light emitting layer disposed on the bank and the anode electrode and covering the display area and the non-display area;
   a cathode electrode disposed on the light emitting layer;
   an encapsulation layer disposed on the cathode electrode and covering the display area and the non-display area; and
   a cover plate disposed on the encapsulation layer.

10. The electroluminescence display device according to the claim 9, wherein the light emitting layer covers the display area and the non-display area, within a range of the encapsulation layer, and wherein the light emitting layer is disposed on a top surface and a bottom surface of the trench excepting a wall surface of the trench linking the top surface and the bottom surface.

11. The electroluminescence display device according to the claim 9, wherein an end edge of the light emitting layer is aligned with an end edge of the encapsulation layer.

12. The electroluminescence display device according to the claim 9, wherein an end edge of the trench overlaps with an end edge of the encapsulation layer.

13. The electroluminescence display device according to the claim 9, wherein an end edge of the trench is extended from an end edge of the encapsulation layer to an end edge of the substrate.

14. The electroluminescence display device according to the claim 9, wherein an end edge of the trench is apart from an end edge of the encapsulation layer into the display area with a predetermined distance.

15. The electroluminescence display device according to the claim 9, wherein the plurality of trenches is divided into a plurality of trench groups.

16. An electroluminescence display device comprising:
   a display area and a non-display area surrounding the display area defined at a substrate;
   a planarization layer and a bank layer disposed in the display area and the non-display area;
   a plurality of trenches disposed in the non-display area;
   a light emitting diode including a light emitting layer disposed on the planarization layer;
   a dummy light emitting layer disposed in the non-display area and extended from the light emitting layer, wherein the dummy light emitting layer has portions electrically disconnected from the light emitting layer and disposed on top and bottom surface surfaces of the plurality of trenches;
   an encapsulation layer covering the light emitting layer and the dummy light emitting layer including the plurality of trenches;
   a cover plate disposed on the encapsulation layer; and
   a driving integrated circuit and a pad portion located on an outer portion of the substrate where the driving integrated circuit and the pad portion do not overlap with cover plate.

17. The electroluminescence display device according to the claim 16, wherein an end edge of the dummy light emitting layer is aligned with an end edge of the encapsulation layer.

18. The electroluminescence display device according to the claim 16, wherein an end edge of the bank layer is apart from an end edge of the encapsulation layer into the display area with a predetermined distance.

19. The electroluminescence display device according to the claim 16, wherein an end edge of the bank is apart from an end edge of the encapsulation layer to an end edge of the substrate with a predetermined distance.

20. The electroluminescence display device according to the claim 16, wherein the plurality of trenches is disposed with a predetermined distance between an end edge of the substrate and an end edge of the display area.

* * * * *